(12) United States Patent
Yamada et al.

(10) Patent No.: US 10,861,530 B2
(45) Date of Patent: Dec. 8, 2020

(54) SEMICONDUCTOR STORAGE DEVICE

(71) Applicant: ULTRAMEMORY INC., Tokyo (JP)

(72) Inventors: Yasutoshi Yamada, Tokyo (JP); Ryuji Takishita, Tokyo (JP)

(73) Assignee: Ultramemory Inc., Tokyo (JP)

( * ) Notice: Subject to any disclaimer, the term of this patent is extended or adjusted under 35 U.S.C. 154(b) by 98 days.

(21) Appl. No.: 16/090,716

(22) PCT Filed: Apr. 8, 2016

(86) PCT No.: PCT/JP2016/061582
§ 371 (c)(1),
(2) Date: Oct. 2, 2018

(87) PCT Pub. No.: WO2017/175392
PCT Pub. Date: Oct. 12, 2017

(65) Prior Publication Data
US 2019/0122722 A1 Apr. 25, 2019

(51) Int. Cl.
*G11C 11/406* (2006.01)
*G11C 11/408* (2006.01)

(52) U.S. Cl.
CPC ...... *G11C 11/40603* (2013.01); *G11C 11/408* (2013.01); *G11C 11/4082* (2013.01); *G11C 11/40615* (2013.01)

(58) Field of Classification Search
CPC ........ G11C 11/40615; G11C 11/40603; G11C 11/4082
See application file for complete search history.

(56) References Cited

U.S. PATENT DOCUMENTS

| 2005/0035959 A1 | 2/2005 | Lin et al. |
| 2013/0304982 A1 | 11/2013 | Jung et al. |
| 2015/0243338 A1 | 8/2015 | Sohn et al. |

FOREIGN PATENT DOCUMENTS

| JP | 2009-059452 A | 3/2009 |
| JP | 2013-239228 A | 11/2013 |
| JP | 2015-162253 A | 9/2015 |
| JP | 2015-191676 A | 11/2015 |

*Primary Examiner* — Jay W. Radke
(74) *Attorney, Agent, or Firm* — Muncy, Geissler, Olds & Lowe, P.C.

(57) ABSTRACT

The purpose of the present invention is to achieve a system for solving a row hammer issue without significantly increasing a DRAM chip area. A semiconductor storage device comprises: a memory unit including a plurality of memory cells; an address latch unit that receives an active command and an address therefor, and latches and holds the address every time the active command is received; a refresh control unit that, when receiving a refresh command, instructs a memory access control unit to carry out a regular refresh operation while instructing the memory access control unit to carry out an interrupt refresh operation for an address near the address latched by the address latch unit; and the memory access control unit that carries out the regular refresh operation and the interrupt refresh operation for the memory unit on the basis of the instruction from the refresh control unit.

13 Claims, 8 Drawing Sheets

SEMICONDUCTOR STORAGE DEVICE

TECHNICAL FIELD

The present invention relates to a semiconductor storage device. Particularly, the invention relates to a semiconductor storage device in which resistance against a failure due to a row hammer issue is improved.

BACKGROUND ART

Progress in miniaturization of a manufacturing process of a dynamic random access memory (DRAM) is significant. According to this, interference between memory cells is likely to occur. In addition, due to the miniaturization of the manufacturing process, a variation increases, and a memory cell susceptible to the interference is likely to be manufactured. As a result, data corruption of the memory cell becomes significant.

Particularly, recently, a problem in which when access to a row in a specific address is repeated, data of a nearby row of the row is corrupted has attracted attention. The problem is referred to as a row hammer issue. With regard to the row hammer issue, various solutions have been suggested. Patent Document 1

Patent Document 1 described below discloses a method in which the number of times of access to a row of a DRAM is counted, and in a case where a count number reaches a predetermined threshold value, a nearby row of the row is refreshed.

In the method described in Patent Document 1, in addition to a regular (typical) refresh operation in the DRAM, an address of a nearby row of a row in which the number of times of access reaches a threshold value is refreshed in an interrupt manner, and thus the number of times of refresh is further increased in comparison to the related art. Accordingly, it is considered that access performance of the DRAM deteriorates due to an increase in the number of times of refresh. In addition, it is necessary to provide a count circuit, which counts the number of times of access to each row, in the entirety of rows of the DRAM, and thus there is a problem that a DRAM area increases. Accordingly, in the DRAM having the same capacity, a chip area increases. Patent Document 2

Patent Document 2 described below discloses a method in which interrupt refresh is executed by approximately the same principle as in the method described in Patent Document 1. However, Patent Document 2 suggests a method in which a count of the number of times of access to a row (address), which becomes a target of a refresh operation by regular refresh, is reset. It is considered that execution of interrupt refresh with respect to the row is further suppressed by the above-described operation in comparison to Patent Document 1.

According to the method disclosed in Patent Document 2, the number of times of the interrupt refresh is suppressed, and thus it is considered that deterioration of performance of the DRAM is less in comparison to the method disclosed in Patent Document 1.

However, even in the method disclosed in Patent Document 2, as in the method disclosed in Patent Document 1, a count circuit that counts access to each row (address) is necessary. The count circuit is typically constituted by an SRAM that stores the number of times of access, and thus it is considered that a problem related to an increase in a DRAM chip area due to mounting of the SRAM also exists in Patent Document 2 similar to Patent Document 1.

Patent Document 1: Japanese Unexamined Patent Application, Publication No. 2013-239228
Patent Document 2: Japanese Unexamined Patent Application, Publication No. 2015-162253

DISCLOSURE OF THE INVENTION

Problems to be Solved by the Invention

The invention has been made in consideration of the above-described circumstances, and an object thereof is to realize a system for solving a row hammer issue without significantly increasing a DRAM chip area.

Means for Solving the Problems (1) To accomplish the above-described object, according to an aspect of the invention, there is provided a semiconductor storage device including: a memory unit that includes a plurality of memory cells; an address latch unit that receives an address and an active command that is applied to the memory cells designated by the address, and successively latches the address at the time of receiving the active command whenever the active command is received; a refresh control unit that instructs a memory access control unit to execute a regular refresh operation based on a refresh command on the memory unit in the case of receiving the refresh command, and instructs the memory access control unit to execute an interrupt refresh operation, which is a refresh operation based on the address latched by the address latch unit, on a nearby address of the address; and the memory access control unit that executes the regular refresh operation and the interrupt refresh operation on the memory unit on the basis of the instruction from the refresh control unit.

(2) To accomplish the above-described object, according to another aspect of the invention, there is provided a semiconductor storage device including: a memory unit that includes a plurality of memory cells; an address latch unit that receives the address and an active command that is applied to the memory cells designated by the address, latches the address at the time of receiving the active command whenever the active command is received, and retains n pieces of latched addresses; a refresh control unit that instructs a memory access control unit to execute a regular refresh operation based on a refresh command on the memory unit in the case of receiving the refresh command, and instructs the memory access control unit to execute an interrupt refresh operation, which is a refresh operation based on one or more addresses latched by the address latch unit, on a nearby address of the address; and the memory access control unit that executes the regular refresh operation and the interrupt refresh operation on the memory unit on the basis of the instruction from the refresh control unit. The address latch unit is reset in a case where the memory access control unit executes the interrupt refresh operation, and enters a state capable of latching a subsequent address at the time of receiving a subsequent active command. Here, n is a natural number.

(3) In addition, in the semiconductor storage device according to (2), in the address latch unit, in a case where the memory access control unit executes the interrupt refresh operation, only the subsequent address that becomes the basis of the interrupt refresh operation may be reset, and the address latch unit may enter a state capable of latching an address at the time of receiving the subsequent active command.

(4) In addition, in the semiconductor storage device according to (2), the refresh control unit may instruct the memory access control unit to execute an interrupt refresh operation, which is a refresh operation based on any one address of the addresses latched by the address latch unit, on only a nearby address of the one address, and in the address latch unit, in a case where the refresh control unit executes the interrupt refresh operation, the only one address that becomes the basis of the interrupt refresh operation may be reset, and the address latch unit may enter a state capable of latching a subsequent address at the time of receiving the subsequent active command.

(5) In addition, the semiconductor storage device according to any one of (2) to (4) may further includes a monitor start unit that allows a latch operation of the address latch unit to be initiated after receiving m pieces of the active command from reception of the refresh command. Here, m is a natural number.

(6) In addition, in the semiconductor storage device according to (5), the monitor start unit may allow a latch operation of the address latch unit to be initiated after receiving arbitrary k pieces of the active commands from reception of the refresh command. Here, k is an arbitrary natural number.

(7) In addition, the semiconductor storage device according to any one of (2) to (6) may further include: an access count address latch unit that receives an address and an active command that is applied to the memory cells designated by the address, monitors the address at the time of receiving the active command, and counts the number of times of access with respect to the same address; and an upper limit determination unit that allows the address latch unit to latch the same address in a case where the number of times of access to the same address, which is counted by the access count address latch unit, exceeds a predetermined value.

(8) In addition, the semiconductor storage device according to any one of (1) to (7) may further include an address comparison unit that compares the address at the time of receiving the active command and an address that is latched already by the address latch unit, and allows the address latch unit to execute a latch operation in a case where the addresses are different from each other from a result of the comparison.

(9) In addition, the semiconductor storage device according to any one of (2) to (7) may further include an address comparison unit that compares less than n addresses which are latched already by the address latch unit and the address at the time of receiving the active command, and allows the address latch unit to execute a latch operation of an address at the time of newly receiving the active command only in a case where the addresses are different from each other from a result of the comparison.

(10) In addition, in the semiconductor storage device according to (8) or (9), in a case where a refresh address, when the refresh control unit instructs the memory access control unit to perform the regular refresh operation is a nearby address of the address that is latched by the address latch unit, the address comparison unit may reset the address that is latched by the address latch unit.

(11) In addition, the semiconductor storage device according to any one of (1) to (10) may further include a monitor unit that monitors the active command that is received, and prevents the refresh control unit from instructing the memory access control unit to perform the interrupt refresh operation in a case where the active command is not received after receiving the refresh command.

(12) In addition, in the semiconductor storage device according to any one of (1) to (11), the nearby address of the address at the time of receiving the active command may be either an address obtained by incrementing the address at the time of receiving the active command by "+1" or an address obtained by decrementing the address at the time of receiving the active command by "−1".

(13) In addition, the semiconductor storage device according to any one of (1) to (12), the active command may be a command that activates a word line of the memory unit, and includes at least a read command, a write command, and a refresh command.

Effects of the Invention

As described above, according to the invention, interrupt refresh that is executed to countermeasure the row hammer issue is executed with respect to a row (address) that is estimated to be effective. Accordingly, it is not necessary to provide a circuit that counts access with respect to the row for every row. As a result, it is possible to further reduce an area of a row hammer issue countermeasure circuit in comparison to the related art, and it is possible to prevent an increase in a DRAM chip area.

PREFERRED MODE FOR CARRYING OUT THE INVENTION

Hereinafter, a layered semiconductor device according to preferred embodiments of the invention will be described in detail with reference to the accompanying drawings. Incidentally, embodiments to be described later are illustrative only as means for realizing the invention, and it should be understood that appropriate variations and modifications are made according to a configuration of a device to which the invention is applied or various conditions, and the invention is not limited to the following embodiments.

First. Embodiment 1

Configuration

Figure 1:
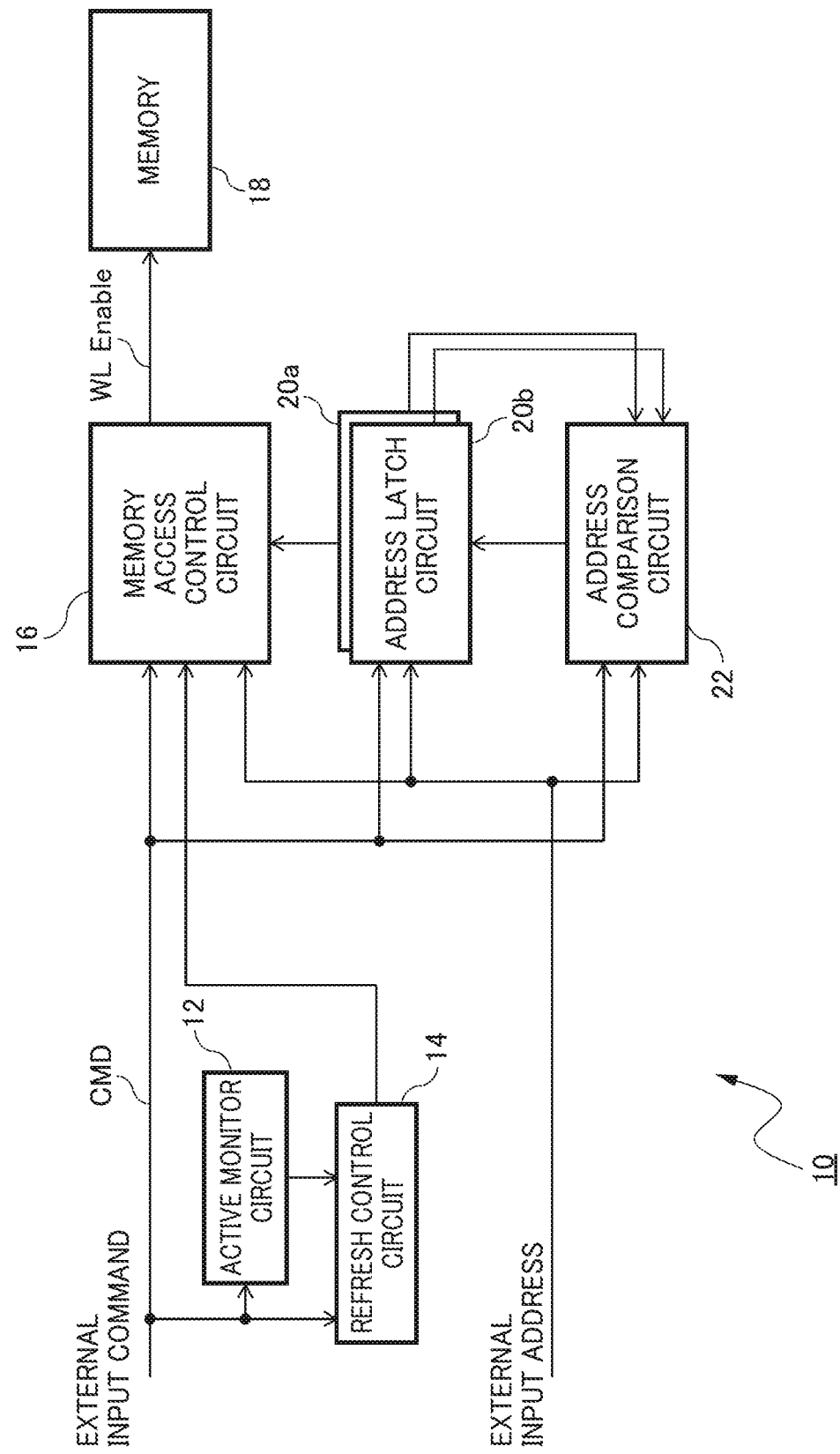
FIG. 1 is a circuit block diagram of a row hammer issue countermeasure circuit of a DRAM device according to Embodiment 1.

FIG. 1 is a circuit block diagram illustrating a row hammer countermeasure circuit 10 of a DRAM device according to Embodiment 1. The row hammer countermeasure circuit 10 illustrated in FIG. 1 is a part of a configuration of the DRAM device. In FIG. 1, a portion other than a memory 18 corresponds to the row hammer countermeasure circuit 10. That is, the row hammer countermeasure circuit 10 includes an active monitor circuit 12, a refresh control circuit 14, a memory access control circuit 16, address latch circuits 20a and 20b, and an address comparison circuit 22. In respective embodiments to be described later, a portion excluding a memory corresponds to a row hammer countermeasure circuit.

In FIG. 1, an external input command and an external input address are input to the DRAM device in combination with each other. The DRAM device executes an operation that is designated by the external input command with respect to a memory cell that is designated by the external input address. In this manner, the external input address and the external input command that designates processing with respect to a memory cell designated by the external input address are simultaneously input to the DRAM device. The external input command is input to a memory access control circuit 16. The memory access control circuit 16 is a circuit that controls an operation of the DRAM device, and executes a predetermined operation with respect to the memory 18 on the basis of the external input command that is input. Incidentally, the memory 18 corresponds to a preferred example of a memory unit in the appended claims. In addition, memories 38, 58, and 78 in the following embodiments also correspond to a preferred example of the memory unit in the appended claims.

In Embodiment 1, the external input command is input to the active monitor circuit 12, the refresh control circuit 14, the address latch circuits 20a and 20b, and the address comparison circuit 22 in addition to the memory access control circuit 16. The external input address is input to the memory access control circuit 16. The memory access control circuit 16 is a circuit that controls an operation of the DRAM device, and executes a predetermined operation designated by the external input command with respect to a memory cell that is designated by the external input address that is input.

In Embodiment 1, the external input address is input to the address latch circuits 20a and 20b, and the address comparison circuit 22 in addition to the memory access control circuit 16. The refresh control circuit 14 is a circuit that controls refresh of the DRAM device. First, in a case where a refresh command is input as the external input command, the refresh control circuit 14 controls the memory access control circuit 16 to execute a regular (typical) refresh operation. Literally, the operation itself is a refresh operation in the related art. The memory access control circuit 16 corresponds to a preferred example of a memory access control unit in the appended claims. Memory access control circuits 36, 56, and 76 in the following Embodiments 2 to 4 also correspond to a preferred example of the memory access control unit in the appended claims.

In Embodiment 1, a characteristic configuration of the refresh control circuit 14 is as follows. Specifically, when executing the regular refresh operation, in a case where an active command, which is input before the refresh command is input, exists, an interrupt refresh operation is executed in addition to the regular refresh operation.

In Embodiment 1, the active command is an external input command that activates a word line in the memory 18 of the DRAM device, and representative examples thereof include a read command, a write command, a refresh command, and the like. In a case where the active command is intensively input to a specific address, the row hammer issue occurs as described above. Here, in Embodiment 1, monitoring of an active command that may be a cause for row hammer issue, and the like are performed. Incidentally, the refresh control circuit 14 corresponds to a preferred example of a refresh control unit in the appended claims. In addition, refresh control circuits 34, 54, and 74 in the following embodiments also correspond to a preferred example of the refresh control unit in the appended claims.

The active monitor circuit 12 determines whether or not the active command exists. The active monitor circuit 12 is a circuit that monitors the external input command, and monitors whether or not a predetermined active command is input after a refresh command is input and before a subsequent refresh command is input.

The active monitor circuit 12 monitors the external input command. In a case where after the refresh command is input to the DRAM device, the refresh command is input again in a state in which an active command is not completely input, the active monitor circuit 12 controls the refresh control circuit 14 to be described later so as not to perform the interrupt refresh (suppress the interrupt refresh operation). In this case, the refresh control circuit 14 instructs the memory access control circuit 16 to perform only the regular refresh operation, and the memory access control circuit 16 executes only the regular refresh operation and does not execute the interrupt refresh operation. However, even in a case where the refresh control circuit 14 suppresses the interrupt refresh operation, if an address latch circuit 20 latches an address, the memory access control circuit 16 executes the interrupt refresh on the basis of the address. Incidentally, the active monitor circuit 12 corresponds to a preferred example of a monitor unit in the appended claims. In addition, active monitor circuits 32, 52, and 72 to be described later also correspond to a preferred example of the monitor unit in the appended claims.

On the other hand, in a case where the active monitor circuit 12 does not suppress the interrupt refresh operation (in a case where the active command exists), when executing the regular refresh operation, the refresh control circuit 14 allows the memory access control circuit 16 to execute the interrupt refresh operation.

The address latch circuits 20a and 20b are latch circuits which retain an address when executing the interrupt refresh operation, the refresh control circuit 14 instructs the memory access control circuit 16 to perform interrupt refresh in association with the address that is retained in the address latch circuit 20. The address latch circuit 20 monitors the external input command, and in a case where an active command other than the refresh command is input, the address latch circuit 20 latches an external input address when the external input command (other than the refresh command) is input.

In Embodiment 1, the two address latch circuits 20a and 20b are provided, and two addresses can be latched. The number "2" of the latches corresponds to a preferred example of "n" in the appended claims. The address comparison circuit 22 is a circuit that performs control so that the address latch circuit 20 does not latch the same address. The address latch circuit 20 latches the external input address whenever the active command is input, but an address to be latched and an address latched already by the address latch circuit 20 are compared with each other by the address comparison circuit 22. From a result of the comparison, in a case where the address latched already and the address to be latched are the same as each other, the address comparison circuit 22 controls the address latch circuit 20 to stop a latch operation. Due to the operation, the same address is prevented from being latched. Incidentally, the address comparison circuit 22 corresponds to a preferred example of an address comparison unit in the appended claims. Furthermore, address comparison circuits 42, 62, and 82 in the following embodiments also correspond to a preferred example of the address comparison unit in the appended claims.

In Embodiment 1, an address that is latched by the address latch circuit 20 is an address that becomes the basis of the interrupt refresh. Accordingly, it is useless to latch the same address, and thus the address comparison circuit 22 is provided to allow the address latch circuit 20a and the address latch circuit 20b to latch addresses different from each other.

The address latch circuits 20a and 20b in Embodiment 1 monitor the external input command, and in a case where the external input command is the refresh command, the address latch circuits 20a and 20b are reset at a predetermined timing and enter a state capable of newly latching an address. In addition, whenever an active command other than the refresh command is input, the external input address that is input at that time is latched depending on the comparison performed by the address comparison circuit 22. The address latch circuit 20 executes the latch operation twice, and stops the latch operation after latching two addresses.

According to the operation, the address latch circuit 20 can latch two external input addresses as the maximum at the time of the active command between the refresh commands. That is, the address latch circuit 20 latches addresses (different from each other) of first two active commands in principle after the refresh command is input. Interrupt refresh when the refresh command is input is executed on the basis of the addresses which are latched as described above. Incidentally, the address latch circuit 20 corresponds to a preferred example of an address latch unit in the appended claims. In addition, address latch circuits 40, 60, and 80 in the following embodiments also corresponds to a preferred example of the address latch unit in the appended claims.

A characteristic configuration in Embodiment 1 is as follows. Specifically, when the refresh control circuit 14 performs the regular refresh operation on the basis of the refresh command, an address at the time of an active command, which is input between a previous regular refresh and a current interrupt refresh operation, is latched (retained). In addition, the interrupt refresh is executed on the basis of the latched address. According to this, it is possible to execute an interrupt refresh operation based on an address when an active command that becomes a cause for the row hammer issue is input, and it is possible to perform the interrupt refresh operation with respect to an address in which the row hammer issue is likely to occur.

Operation

Hereinafter, an operation of the row hammer countermeasure circuit 10 of Embodiment 1 described in FIG. 1 will be described on the basis of a time chart of FIG. 2.

Figure 2:
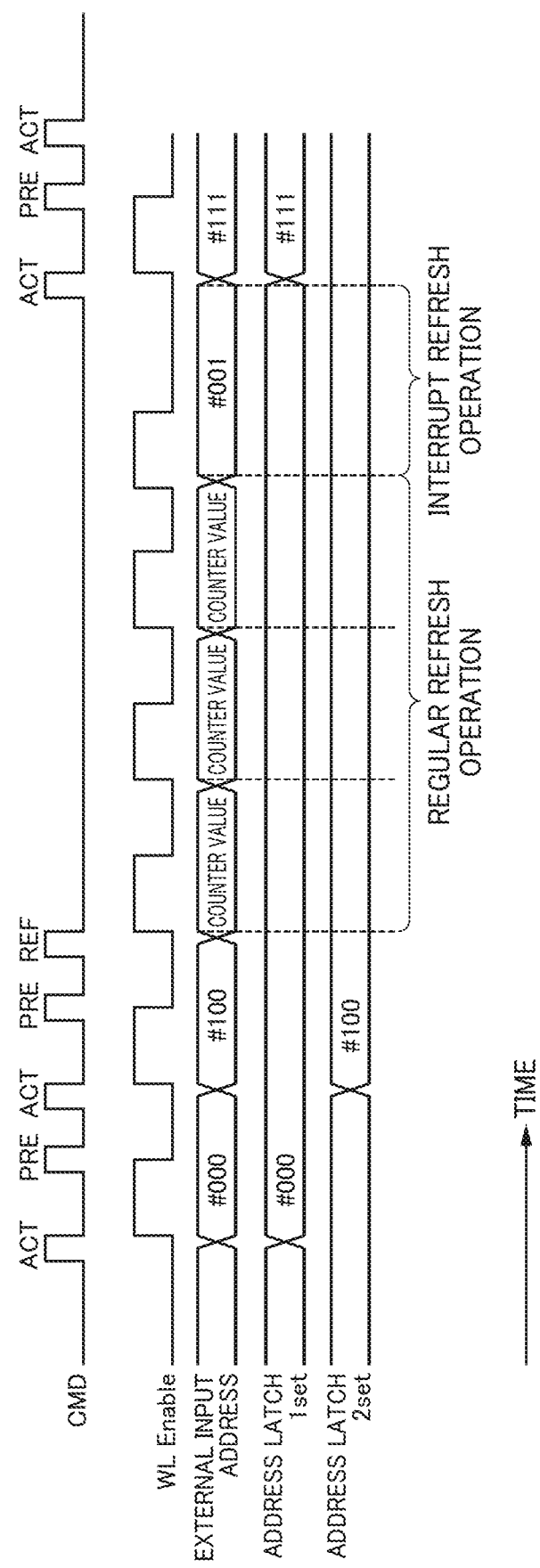
FIG. 2 is a time chart illustrating an operation of the row hammer issue countermeasure circuit according to Embodiment 1.

In the time chart of FIG. 2, CMD represents the external input command in FIG. 1. ACT represents an active command other than the refresh command, and examples thereof include a read command and the like. PRE represents precharge command with respect to the DRAM device. REF represents the refresh command. WL Enable in FIG. 2 is a signal that is output from the memory access control circuit 16 to the memory 18, and is a signal that activates a word (row) line. External input address in FIG. 2 represents the external input address in FIG. 1. Address latch 1set in FIG. 2 represents the address latch circuit 20a in FIG. 1, and address latch 2set represents the address latch circuit 20b in FIG. 1.

In the time chart of FIG. 2, first, when the active command ACT is input, the memory access control circuit 16 outputs the WL Enable by one pulse in correspondence with the input. Incidentally, at a predetermined timing in the one pulse, the precharge command PRE is input.

In the time chart of FIG. 2, two active commands ACT are successively input, and thus the external input address at that time sequentially becomes #000 and #100. The first address #000 is latched by the address latch 1set (the address latch circuit 20a). In addition, the subsequent address #100 is latched by the address latch 2set (the address latch circuit 20b).

When the refresh command REF is input after the two active commands ACT, the refresh control circuit 14 instructs the memory access control circuit 16 to perform a refresh operation on the basis of the refresh command REF.

First, the refresh control circuit 14 executes a regular (typical) refresh operation on the basis of the refresh command REF and the instruction from the refresh control circuit 14. In the example illustrated in FIG. 2, as predetermined refresh counter values, three values can be used, and thus the refresh operation is executed three times. In FIG. 2, the counter values are predetermined refresh counter values (not illustrated), and all of the counter values are shown as "counter value" in FIG. 2. However, the counter values are values which increment by +2 for every refresh operation. In Embodiment 1, in a refresh operation performed once, a refresh operation with respect to two word lines is executed at a time, and thus the counter value increments by +2.

A characteristic configuration in this embodiment is in that the interrupt refresh operation is executed after the regular refresh operation is performed three times. The refresh control circuit 14 also instructs the memory access control circuit 16 to perform the interrupt refresh operation. However, as described above, in a case where the active monitor circuit 12 does not detect an active command between refresh commands, the refresh control circuit 14 does not instruct the memory access control circuit 16 to perform the interrupt refresh operation, and the interrupt refresh operation in FIG. 2 is not executed.

In Embodiment 1, the interrupt refresh operation is performed once. With regard to an address at that time, an address latched by the address latch 1set and an address latched by the address latch 2set are alternately used as the basis of the interrupt refresh operation. In the example in FIG. 2, the address #000 latched by the address latch 1set is used as the basis. Actually, an address that becomes a target of the interrupt refresh operation is a "nearby" address of the address #000. In Embodiment 1, for example, a value obtained by inverting a lower one bit of the address latched by the address latch circuit 20 is used. That is, an address, which is obtained by incrementing or decrementing the address latched by the address latch 1set or 2set by "+1" or by "−1", is an address that becomes a target of the refresh operation. In the example of FIG. 2, #001, which is an address by incrementing the address #000 latched by the address latch 1set by +1, is an address that becomes a target of the refresh operation.

The DRAM device according to Embodiment 1 will be described with reference to a DRAM device in which every two word lines are controlled as a pair. In the DRAM device, word lines which make a pair are disposed to be adjacent to each other, and thus a word line in which the row hammer issue occurs is determined in advance as a counterpart word line of the pair. Accordingly, in a case where an active command is applied to the address that is latched by the address latch circuit 20, the row hammer issue occurs in an address that is obtained by inverting the lowermost one bit of the latched address, that is, an address obtained by incrementing or decrementing the latched address by "+1" or "−1".

The memory access control circuit 16 calculates an address, for which the interrupt refresh operation is executed, by inverting the lowermost one bit of the address latched by the address latch circuit 20. Incidentally, in Embodiment 1, the address latch circuit 20 latches two addresses. Here, in the interrupt refresh operation, an address related to the refresh operation is calculated on the basis of any one address. In addition, the address that becomes the basis of the calculation is reset after the refresh operation, and it transitions to a state capable of latching a new address. In the example in FIG. 2, #000 of the address latch 1set can be used, and thus the interrupt refresh operation is executed with respect to #001. Accordingly, the address latch 1set is reset, and enters a state capable of latching a new address. As a result, in FIG. 2, with regard to the address latch 1set, an external input address #111 when the active command ACT is input immediately after the refresh operation is latched.

On the other hand, an address #100 that is latched by the address latch 2set is not used in the interrupt refresh operation as the basis, and thus the latched address is retained. In addition, the address #100 can be used as the basis in an interrupt refresh operation in the subsequent refresh operation. That is, in a refresh operation that is performed subsequent to the refresh operation illustrated in FIG. 2, the interrupt refresh operation is executed with respect to #101 obtained by incrementing #100 that is an address latched by the address latch 2set by "+1".

As described above, in Embodiment 1, the address latch circuit 20 can latch two addresses, and can alternately use the two addresses as the basis of the interrupt refresh operation. In addition, the address latch (1set or 2set) that is the basis of calculation of an address that becomes a target of the interrupt refresh operation is reset and enters a state capable of latching a new address.

Incidentally, in a case where another active command is not input between the refresh commands, as described above, the active monitor circuit 32 controls the refresh control circuit 14 to execute only the regular refresh operation without executing the interrupt refresh operation.

Point of View on Row Hammer Issue

To cope with the row hammer issue, the present inventors considered as follows.

(1) First, the maximum number of times of the row hammer issue has been examined. Examination has been made on the assumption that the total number of word lines per one bank of the DRAM device according to Embodiment 1 is, for example, 32 k (WL). Here, WL represents a word line, and the number of the word lines.

In Embodiment 1, the number of word lines which are refreshed in the regular refresh (AREF (auto-refresh)) performed once is 6 WL (word line) per one bank as described above. As described in FIG. 2, two word lines are accessed three times, and thus the number of word lines is a total of six. In addition, a cycle tREF of the refresh operation is 7.8 µs. That is, in principle, the refresh command is input to the DRAM device for every 7.8 µsec. In addition, it is assumed that an interval tRC (min) in which the active command is input is 50 ns.

tRC is a minimum value.

(2) Under the assumption described above, the number of times of regular refresh necessary to refresh all of the word lines per one bank is calculated as follows.

32 kWL/6 WL approximately 5333 times

Since the refresh cycle tREF is 7.8 µs, time taken until one bank is completely refreshed is (32 kWL/6 WL)*7.8 µs approximately 41600 µs The number of times of issuing of the active command is, ((32 kWL/6 WL)*7.8 µs/50 ns)=832 k Accordingly, there is a possibility that the active command is issued 832 k times to the maximum during the refresh interval. This is described as RH (max)=832 k.

(3) The number of target word lines necessary to perform processing for solving the RH issue In addition, in a semiconductor process of forming the DRAM device, the number of times of RH that is guaranteed by the process, that is, the number of times of the active command in which the row hammer issue does not occur is set to 100 k.

That is, when performing the interrupt refresh operation before the active command is applied 100 k times, the row hammer issue does not occur.

Accordingly, the number of word lines that is necessary to cope with the row hammer issue is approximately 8.32. 8.32 (WL)=832 k/100 k. In this manner, target word lines which are necessary to be subjected to processing related to the row hammer issue is referred to as RH target word lines. Here, the number of the RH target word lines is approximately 8.32.

(4) In addition, examination is made on probability of hitting to the RH target word lines (refresh is performed with respect to the word lines) during the regular refresh (AREF). First, probability in which the RH target word lines are activated immediately before the refresh command is input is obtained as 0.1202 (=100/832). In this case, probability that the RH target word lines are not hit during execution of N times of refresh operations is obtained as follows.

N=1 0.8798

N=2 0.7741

N=X (1−100/832) to the power of X

N=5.3 K/64 2.481E-5

The interrupt refresh is executed once per 64 times of the AREF command (refresh command).

N=5.3 K/8 1.435E-37

The interrupt refresh is executed once per 8 times of the AREF command (refresh command).

N=5.3 K 1.799E-295

The interrupt refresh is executed once per one AREF command (refresh command). This corresponds to Embodiment 1.

As described above, according to the interrupt refresh method that is employed in Embodiment 1, when the interrupt refresh operation is executed for every regular refresh operation on the basis of the external input address when the active command is input, it is possible to perform control in order for the row hammer issue not to occur with high probability. As described above, according to Embodiment 1, even though a counter is not provided for every word line, it is possible to realize a DRAM device capable of coping with the row hammer issue. Accordingly, it is possible to provide a DRAM in which a semiconductor chip area can be effectively used and area efficiency is excellent.

Modification Example of Embodiment 1

(1) In Embodiment 1, the interrupt refresh is performed on the basis of the external input address at the time of an active command that is input between a plurality of the regular (typical) refresh operations. Particularly, description has been of an example in which an address when "first" two active commands are input after the refresh operation is latched, and is used in the interrupt refresh operation. That is, in Embodiment 1, the address latch circuit 20 is stopped after latching first two addresses.

However, the address latch circuit 20 may successively perform latching without stoppage. In this configuration, addresses of two active commands immediately before execution of the refresh operation are latched. Accordingly, an address at the time of a "final" two active command in a period between refresh operations may be latched instead of the "first" two addresses, and may be used as the basis of an address at the time of interrupt refresh. That is, an address may be latched at an arbitrary timing. An adjustment may be appropriately made in accordance with an application of the DRAM device, a use of a computer that can use the DRAM device, and the like.

(2) In Embodiment 1, the address latch circuit 20 has a configuration capable of latching two addresses (correspond to a preferred example of "n" in the appended claims). However, the number of latches may be one. That is, n may be 1. In addition, a configuration capable of latching relatively many addresses is also possible. That is, n may be a natural number of 3 or greater. In the following Embodiment 2 to Embodiment 4, description will be given of a case where n is 2 as an example, but n may be 1 or 3 or greater.

(3) In addition, in Embodiment 1, the interrupt refresh operation is executed to one address with respect to the regular refresh performed once, but the interrupt refresh operation may be executed to two or greater addresses with respect to the regular refresh operation performed once.

(4) In addition, in Embodiment 1, an address adjacent to an address when the active command is input is set as a target of the interrupt refresh operation as an address at which the row hammer issue may occur. However, a nearby address instead of the adjacent address may be set as the target, and the interrupt refresh operation may be executed in a state in which word lines of a plurality of nearby addresses are set as the target.

Second. Embodiment 2

Figure 3:
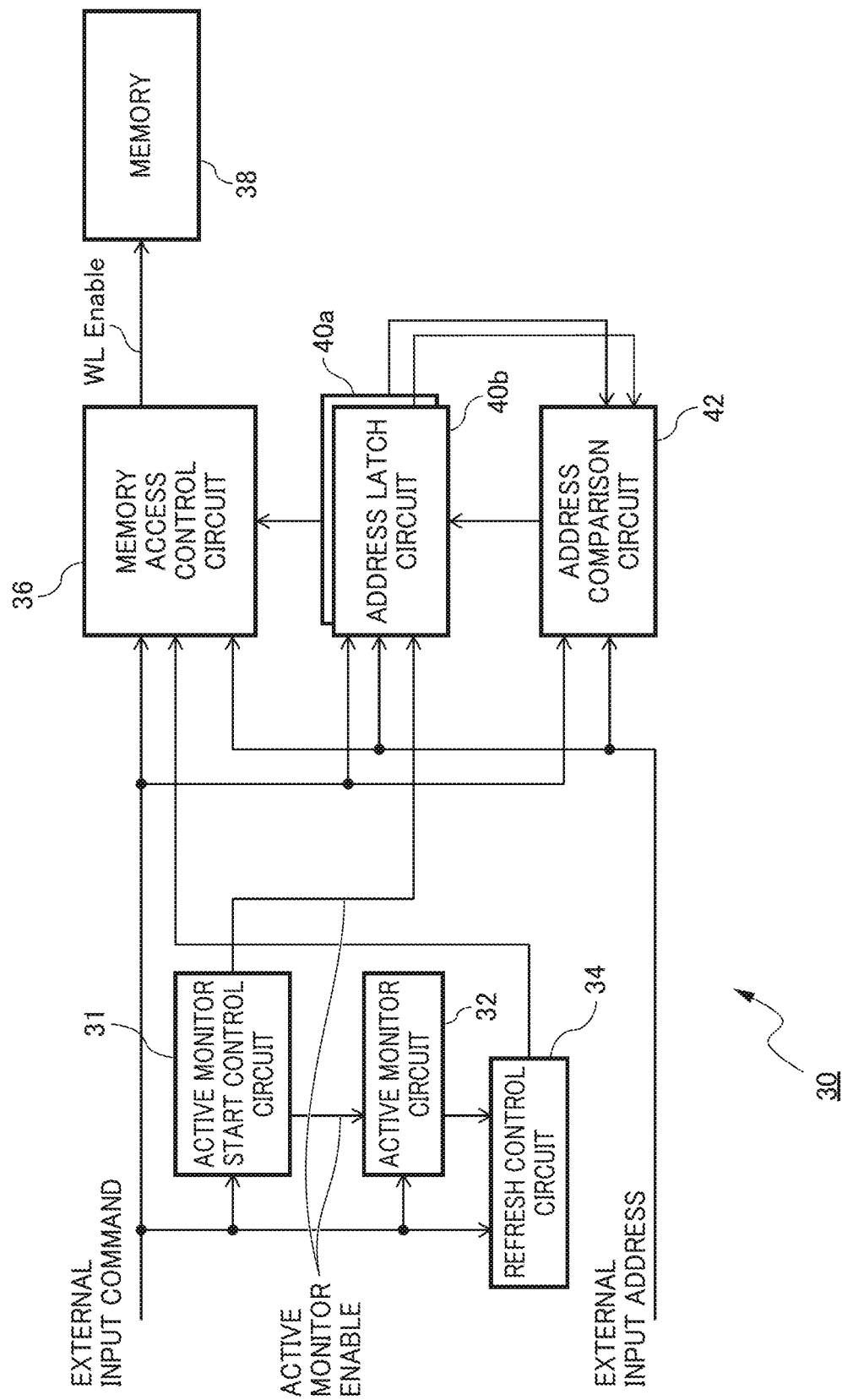
FIG. 3 is a circuit block diagram of a row hammer issue countermeasure circuit of a DRAM device according to Embodiment 2.

In Embodiment 1, after the refresh command is input, first two external input addresses are latched. However, an address at an arbitrary location (timing) may be latched. In Embodiment 2, description will be given of a DRAM device provided with a row hammer countermeasure circuit capable of arbitrarily setting an address latching initiation timing.
Configuration FIG. 3 is a circuit block diagram illustrating a row hammer countermeasure circuit 30 of the DRAM device in Embodiment 2. The row hammer countermeasure circuit 30 illustrated in FIG. 3 is a part of a configuration of the DRAM device. In FIG. 3, a portion other than a memory 38 corresponds to the row hammer countermeasure circuit 30. That is, the row hammer countermeasure circuit 30 includes an active monitor start control circuit 31, an active monitor circuit 32, a refresh control circuit 34, a memory access control circuit 36, address latch circuits 40a and 40b, and an address comparison circuit 42. In FIG. 3, the active monitor start control circuit 31 is a configuration different from the configuration in FIG. 1, and the other configurations are basically the same as in FIG. 1 of Embodiment 1, and basically execute similar operations.

The active monitor start control circuit 31 in Embodiment 2 monitors an external input command, and sets an active monitor enable signal to enable "1", for example, after a third active command is detected from input of the refresh command to allow the active monitor circuit 32 and the address latch circuits 40a and 40b to initiate an operation. Incidentally, the active monitor start control circuit 31 corresponds to a preferred example of a monitor start unit in the appended claims. In addition, active monitor start control circuits 51 and 71 in the following embodiments also correspond to a preferred example of the monitor start unit in the appended claims. The active monitor circuit 32 executes approximately the same operation as in the active monitor circuit 12 in FIG. 1 of Embodiment 1. The active monitor circuit 32 in FIG. 3 performs monitoring of the external input command only in a case where the active monitor enable signal is "1" differently from the active monitor circuit 12 in FIG. 1, and detects whether or not the active command is input.

Accordingly, for example, in a case where only one active command is input between refresh commands REF, the active monitor circuit 32 determines that the active command is not input. This configuration is different from Embodiment 1.

In addition, the address latch circuits 40a and 40b execute approximately the same operation as in the address latch circuits 20a and 20b in FIG. 1 of Embodiment 1. The address latch circuits 40a and 40b in FIG. 3 performs latching of the external input address only in a case where the active monitor enable signal is "1" differently from the address latch circuits 20a and 20b in FIG. 1.

Accordingly, in Embodiment 2, the address latch circuits 40a and 40b initiate latching from an external input address at the time of a third input active command between refresh commands REF. This configuration is different from Embodiment 1. Incidentally, the other operations are similar to the operations of the address latch circuits 20a and 20b in Embodiment 1, and a configuration in which the number of addresses to be latched is two, and the like are similar to those of the address latch circuits 20a and 20b.

As described above, a characteristic configuration in Embodiment 2 is in that a position of a latch initiation address can be arbitrarily designated. The active monitor start control circuit 31 outputs an active monitor enable signal to the active monitor circuit 32, and controls a timing at which the active monitor circuit 32 monitors the external input command as described above. In addition, the active monitor start control circuit 31 outputs the same active monitor enable signal to the address latch circuits 40a and 40b, and controls a timing at which the address latch circuits 40a and 40b latches the external input address.

As the timing that is set by the active monitor start control circuit 31, in the example, the timing from the third active command after the refresh command REF is input is set. However, a timing from a fourth active command or a timing from a fifth active command other than the timing from the third active command may be set, and the timing can be arbitrarily set. The setting may be determined from a design stage of the DRAM device, or may be determined (programmed) at a test stage during a manufacturing process of the DRAM device. The timing may be arbitrarily set by a control signal from an external side after manufacturing of the DRAM device.

Incidentally, typically, the operation can be expressed when the address latch is initiated after receiving m active commands. Here, m is a natural number.

Operation

Hereinafter, an operation of the row hammer countermeasure circuit 30 of Embodiment 2 described in FIG. 3 will be described on the basis of a time chart of FIG. 4. In the time chart of FIG. 4, a signal different from the time chart of FIG. 2 is an active monitor enable signal, and the other signals are basically the same as in the time chart of FIG. 2. In addition, in FIG. 4, an address latch 1set is the address latch circuit 40a and an address latch 2set is the address latch circuit 40b differently from FIG. 2.

Figure 4:
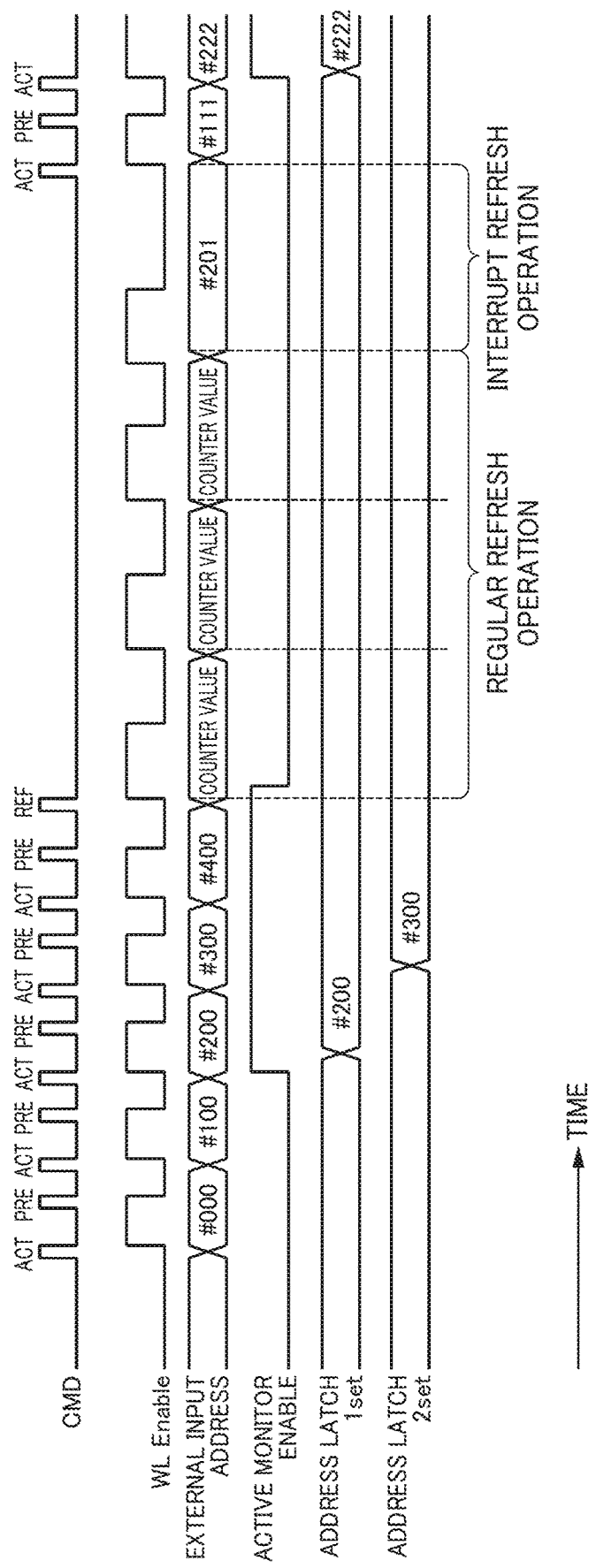
FIG. 4 is a time chart illustrating an operation of the row hammer issue countermeasure circuit according to Embodiment 2.

In the time chart of FIG. 4, first, when the active command ACT is input, the memory access control circuit 16 outputs a WL-Enable signal by one pulse in correspondence with the input. Incidentally, a configuration in which at a predetermined timing in the one pulse, a precharge command PRE is input is the same as in FIG. 2.

The time chart of FIG. 4 illustrates an example in which five active commands ACT are successively input. External input addresses at that time are #000, #100, #200, #300, and #400 in this order. A characteristic configuration in Embodiment 2 is in that the active monitor enable signal is set to "0" until first two active command are input. The signal is a signal that is generated by the active monitor start control circuit 31 as described above, and is supplied to the active monitor circuit 32 or the address latch circuits 40a and 40b. After detecting two pieces of active commands, the active monitor start control circuit 31 sets the active monitor enable signal to "1", enables a monitoring function of the active monitor circuit 32, and allows the address latch circuits 40a and 40b to initiate a latch operation.

As a result, the active monitor circuit 32 detects an active command from a third active command, and perform control to allow the refresh control circuit 34 to execute the interrupt refresh operation at the time of the subsequent regular refresh operation. In addition, the address latch circuits 40a and 40b latches #200 that is an external input address at the time of the third active command. In succession, #300 that is an external input address at the time of a fourth active command is latched.

According to this, as illustrated in FIG. 4, the address latch 1set (address latch circuit 40a) latches the address #200, and the address latch 2set (address latch circuit 40b) latches the address #300. When the refresh command REF is input after the five active commands ACT, the refresh control circuit 34 instructs the memory access control circuit 36 to perform a refresh operation on the basis of the refresh command REF.

As in FIG. 2, the memory access control circuit 36 executes the regular (typical) refresh operation three times on the basis of the refresh command REF and the instruction from the refresh control circuit 34. Even in Embodiment 2, the interrupt refresh operation is executed after the regular refresh operation performed three times. The interrupt refresh operation is the same as in Embodiment 1. In addition, the interrupt refresh operation is performed once. With regard to an address at that time, a configuration in which an address latched by the address latch 1set and an address latched by the address latch 2set are alternately used as the basis of the interrupt refresh operation is the same as in Embodiment 1.

In the example in FIG. 4, the address #200 latched by the address latch 1set is used as the basis. Actually, an address that becomes a target of the interrupt refresh operation is a "nearby" address of the address #200. In Embodiment 2, for example, a value #201 obtained by inverting the lowermost one bit of the address that is latched by the address latch circuit 40a is used as the nearby address.

The other operations are the same as in Embodiment 1, and even in Embodiment 2, as the nearby address, an adjacent address (address in which the lowermost one bit is inverted) is used.

Incidentally, in the time chart illustrated in FIG. 4, after executing the regular refresh operation and the interrupt refresh operation, the active monitor start control circuit 31 sets the active monitor enable signal to "1" from the second active command to monitor an external input command from the second active command. According to this, the address latch circuits 40a and 40b starts to latch an external input address when the active command is input from the second active command. For example, the example illustrated in FIG. 4 illustrates an operation in which #222 that is an external input address at the time of the second active command after the refresh operation is latched by the address latch 1set.

As described above, according to Embodiment 2, a command monitoring initiation timing or an address latching timing can be freely set, and application to a DRAM device of various semiconductor processes is possible, and it is easy to prevent occurrence of the row hammer issue.

Modification Example of Embodiment 2

(1) Various variations described in the modification example of Embodiment 1 are also applicable to Embodiment 2. For example, the address latch circuits 40a and 40b may successively execute the latch operation, and the number of addresses which are latched may be three or greater. The interrupt refresh operation may also be performed two or more times, and the nearby address may be widened to a plurality of word lines in which the row hammer issue may occur.

(2) In addition, in Embodiment 2, after power supply, the active monitor start control circuit allows monitoring of the external input command to be initiated from the third active command, and allow latching of the external input address to be initiated from the third active command. In addition, after execution of the regular refresh operation, the active monitor start control circuit allows monitoring of the external input command to be initiated from the second active command, and allows latching of the external input address to be initiated from the second active command. As described above, in some cases, it is reasonable to make timing different between immediately after power supply and after execution of the regular refresh operation from the viewpoint of an operation of a semiconductor. In addition, each timing can be arbitrarily set. For example, setting may be made in such a manner that monitoring is performed from a fourth active command immediately after power supply, and after execution of the regular refresh operation, monitoring is performed from a sixth active command. However, in accordance with a semiconductor process or a circuit configuration, the same timing may be applied immediately after power supply and after execution of the regular refresh operation. For example, it is preferable that setting is made so that monitoring is initiated from the fourth active command.

(3) Furthermore, it is preferable that the timing is set to an arbitrary timing. For example, processing in which a third address is latched at a current time and a fifth address is latched at a next time, and the like may be performed. The arbitrary timing may be generated by a random number, or the arbitrary timing may be generated by using various pieces of time information such as an active command occurrence timing. The operation can be expressed when initiating address latch after receiving an arbitrary number $k^{th}$ address. In addition, a random number may be generated on the basis of an external input address, and the timing may be generated on the basis of the random number. The timing may be generated by the active monitor start control circuit 31. Here, the arbitrary number k is a natural number.

Third. Embodiment 3

In Embodiment 2, an address of an arbitrary location (timing) is latched, and a new address is not latched, for example, after two addresses are latched. This is basically the same as in Embodiment 1. However, in a computer application, it is known that access is intensively executed to a memory of the same address. Examples thereof include a case where the same variable is successively rewritten, and the like. In a case where access is successively executed to the same address, it is considered that a possibility of occurrence of the row hammer issue is high. Accordingly, in a case where a successively accessed address exists even after two addresses are latched, it is preferable to latch the successively accessed address even though addressees latched until now are discarded different from Embodiment 2.

In Embodiment 3, description will be given of a DRAM device provided with a row hammer countermeasure circuit in which when a successively accessed address exists, the address is latched, and the interrupt refresh based on the address can be executed.

Configuration

Figure 5:
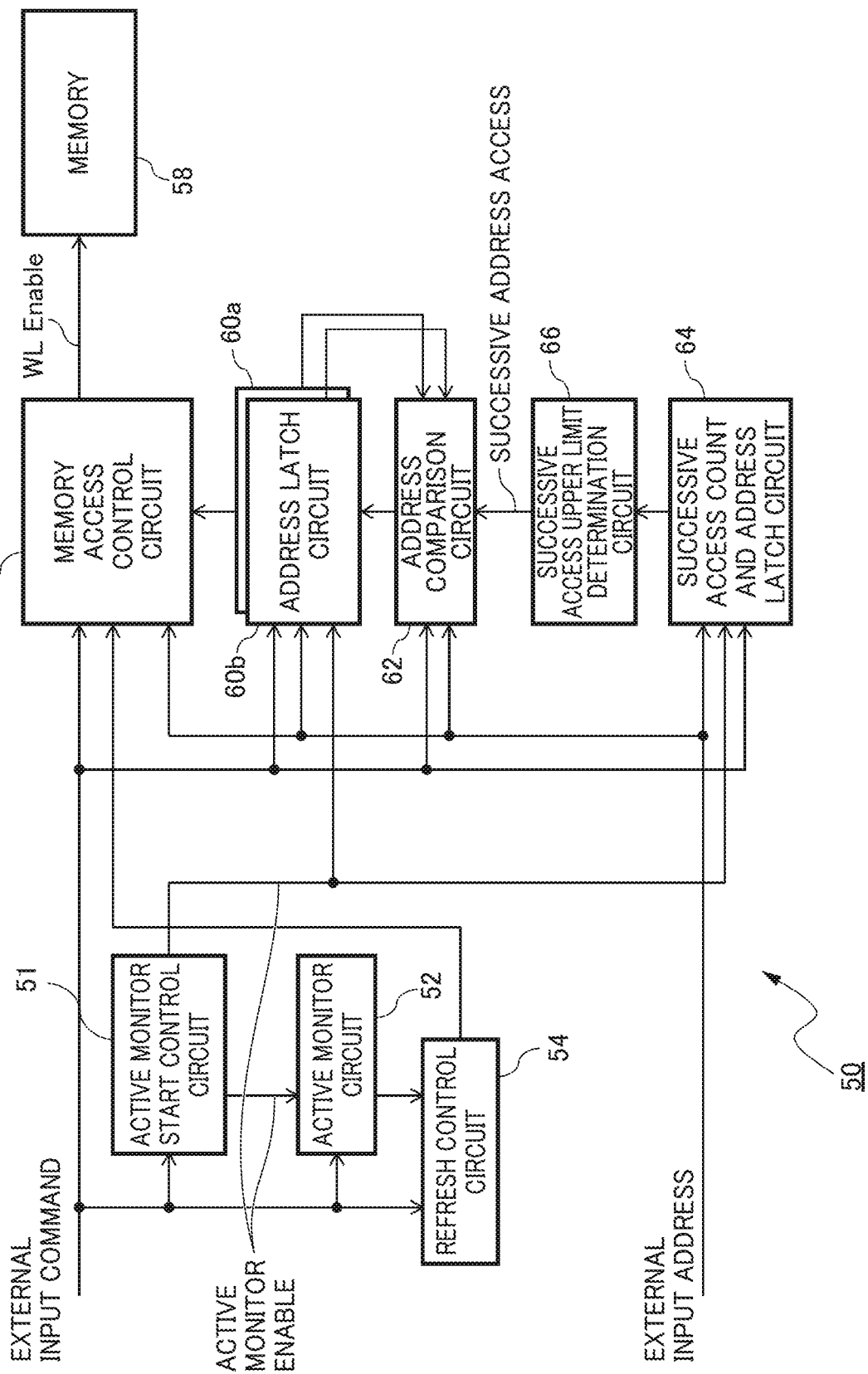
FIG. 5 is a circuit block diagram of a row hammer issue countermeasure circuit of a DRAM device according to Embodiment 3.

FIG. 5 is a circuit block diagram illustrating a row hammer countermeasure circuit 50 of the DRAM device according to Embodiment 3. The row hammer countermeasure circuit 50 illustrated in FIG. 5 is a part of a configuration of the DRAM device. In FIG. 5, a portion other than a memory 58 corresponds to the row hammer countermeasure circuit 50. That is, the row hammer countermeasure circuit 50 includes an active monitor start control circuit 51, an active monitor circuit 52, a refresh control circuit 54, a memory access control circuit 56, address latch circuits 60a and 60b, an address comparison circuit 62, a successive access count circuit 64, and a successive access upper limit determination circuit 66. In FIG. 5, configurations different from FIG. 3 of Embodiment 2 are mainly the successive access count circuit 64 and the successive access upper limit determination circuit 66. The other configurations are basically the same as in FIG. 3 of Embodiment 2, and basically, the same operation as in FIG. 3 and the like is executed except for operations which are particularly described in Embodiment 3.

The successive access count circuit 64 in Embodiment 3 monitors an external input command and an external input address. In a case where the external input address when the active command is input is the same as an external input address when a previous active command is input, the successive access count circuit 64 counts the number of times of input of the same address, and supplies the count value to the successive access upper limit determination circuit 66.

In addition, the successive access upper limit determination circuit 66 in Embodiment 3 compares the count value of the successive access count circuit 64 and a predetermined upper limit u, and checks whether or not the successive access exceeds the upper limit u. In a case where the successive access exceeds the upper limit u, the successive access upper limit determination circuit 66 sets a successive address access signal to "1" and outputs the successive address access signal. Here, the upper limit u is a natural number of 2 or greater. The successive address access signal is supplied to the address comparison circuit 62. Incidentally, the successive access upper limit determination circuit 66 corresponds to a preferred example of an upper limit determination unit in the appended claims. In addition, a successive access upper limit determination circuit 86 in the following Embodiment 4 also corresponds to a preferred example of the upper limit determination unit in the appended claims. Basically, the address comparison circuit 62 executes the same operation as in the address comparison circuit 22 (or 42) in FIG. 1 (or FIG. 3). However, in a case where the successive address access signal becomes "1", the address comparison circuit 62 of Embodiment 3 instructs the address latch circuits 60a and 60b to forcibly latch an external input address.

Basically, the address latch circuits 60a and 60b execute the same operation as in the address latch circuits 20a and 20b (or 40a and 40b) in FIG. 1 (or FIG. 3). However, in a case where the address latch circuits 60a and 60b of Embodiment 3 are instructed by the address comparison circuit 62 to forcibly latch the external input address, even in a case where two addresses are latched already, the address latch circuits 60a and 60b discard any one of the addresses and newly latch an external input address. As a result, it is possible to execute the interrupt refresh operation with respect to a nearby address of the successively accessed address, and it is possible to expect that occurrence of the row hammer issue is more effectively prevent.

Incidentally, the active monitor start control circuit 51 illustrated in FIG. 5 is the same circuit as the active monitor start control circuit 31 in FIG. 3, but in Embodiment 3, description will be given of an example in which the active monitor start control circuit 51 operates so that monitoring of the external input command and latching of the external input address are executed from a second active command.

Operation

Hereinafter, an operation of the row hammer countermeasure circuit 50 of Embodiment 3 described in FIG. 5 will be described on the basis of a time chart of FIG. 6. In the time chart of FIG. 6, a signal different from the time chart of FIG. 4 is a successive address access signal, the other signals are basically the same as in the time chart of FIG. 4. In addition, in FIG. 6, differently from FIG. 4, the address latch 1set is the address latch circuit 60a, and the address latch 2set is the address latch circuit 60b.

In addition, an upper limit u in the successive access upper limit determination circuit 66 is 4, and in a case where an active command related to the same address is successively input four times, a successive address access signal is set to "1". First, in the time chart of FIG. 6, an active command ACT is input, the memory access control circuit 16 outputs a WL Enable signal by one pulse in correspondence with the input. Incidentally, a configuration in which precharge command PRE is input at a predetermined timing in the one pulse is the same as in FIG. 4. Incidentally, in the time chart of FIG. 6, a total of eight active commands are input.

In addition, as described above, in Embodiment 3, the active monitor start control circuit 51 sets an external input command monitoring timing to a timing at which a second external input command is input. Accordingly, as illustrated in FIG. 6, the active monitor enable signal is set to a value of "1" from the second active command.

According to this, monitoring of the active command ACT by the active monitor circuit 52 is executed from the second active command ACT. Similarly, latching of the external input address by the address latch circuits 60*a* and 60*b* is executed from the second active command ACT.

Figure 6:
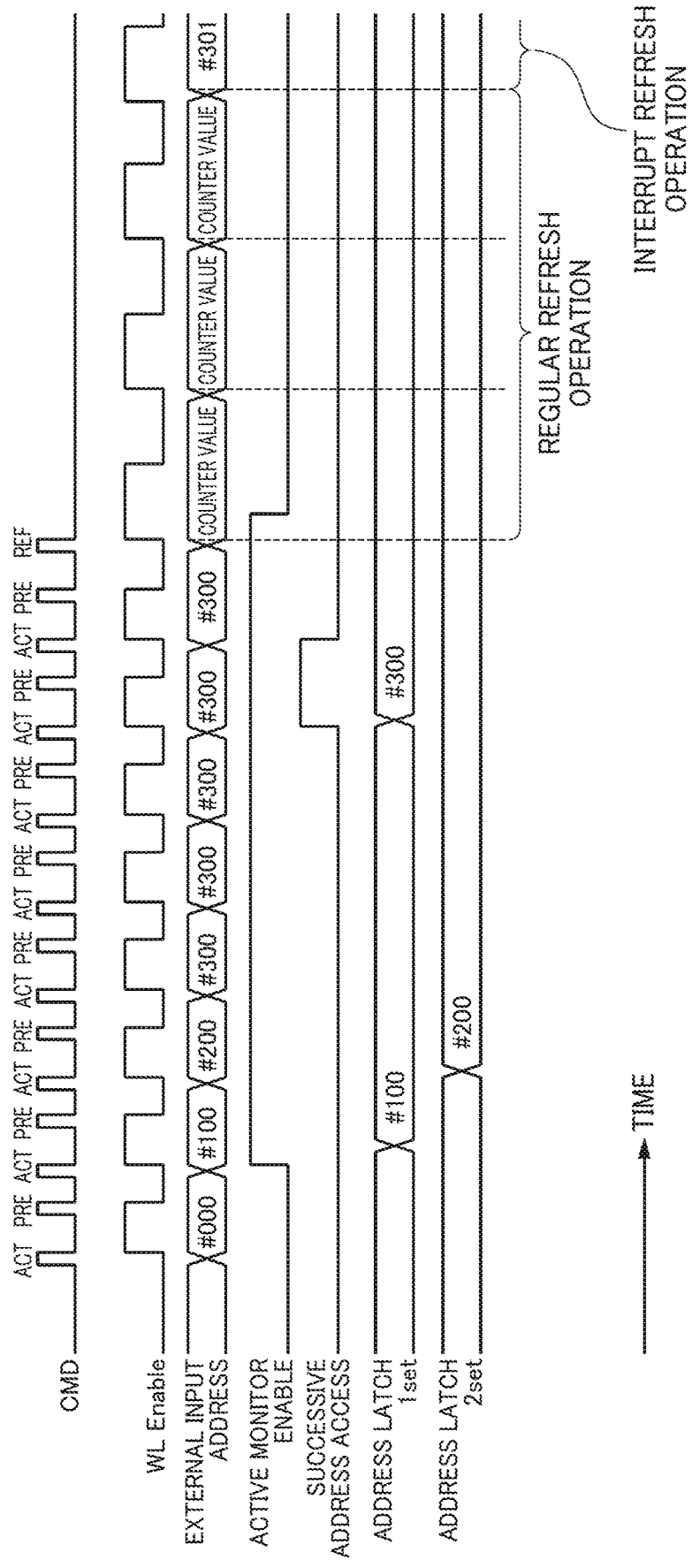
FIG. 6 is a time chart illustrating an operation of the row hammer issue countermeasure circuit according to Embodiment 3.

As a result, in the time chart of FIG. 6, #100 that is an external input address when the second active command ACT is input is latched by the address latch 1set (the address latch circuit 60*a*). Similarly, #200 that is an external input address when a third active command ACT is input is latched by the address latch 2set (the address latch circuit 60*b*).

Then, five active commands ACT are input, any of external input addresses when the active commands ACT are input is #300. As described above, in a case where the successive access upper limit determination circuit 66 according to Embodiment 3 determines that the number of the active commands related to the same address becomes the upper limit u, in the u$^{th}$ active command, the successive access upper limit determination circuit 66 sets the successive address access signal to "1" by one pulse. When the successive address access signal is set to "1" by one pulse, the address comparison circuit 62 allows the address latch circuits 60*a* and 60*b* to latch an external input address on the basis of the signal. As a result, in Embodiment 3, #300 that is the external input address that is successively input to the address latch 1set is latched.

A characteristic configuration in Embodiment 3 is as follows. Specifically, even after the address latch 1set and the address latch 2set latch the external input address in combination, in a case where four (=u) active commands ACT related to the same external input address are successively input, the same external input address is latched by the address latch 1set (or 2set). As a result, in a case where the same address is successively accessed, the interrupt refresh operation can be executed with respect to an address (a word line thereof) based the address, and it is possible to effectively prevent occurrence of the row hammer issue.

In the time chart of FIG. 6, after active commands ACT according to five addresses of #300 are input, the refresh command REF is input. When the refresh command REF is input, the refresh control circuit 54 instructs the memory access control circuit 56 to perform the refresh operation on the basis of the refresh command REF.

The memory access control circuit 56 executes the regular (typical) refresh operation three times on the basis of the refresh command REF and the instruction from the refresh control circuit 54 as in FIG. 2 (or FIG. 4). In addition, as in FIG. 2 (FIG. 4), the interrupt refresh operation is subsequently executed. The interrupt refresh operation is the same as in Embodiments 1 and 2.

A characteristic configuration in Embodiment 3 is in that an address that becomes a target at the time of the interrupt refresh operation is #301 obtained by inverting the lowermost one bit of the address on the basis of #300 that is latched by the address latch 1set. Incidentally, similar to Embodiment 1 or 2, addresses which are latched by the address latches 2set and 1set are alternately and basically used. Accordingly, in some cases, the interrupt refresh may be executed with respect to an address #201 based on #200 that is latched by the address latch 2set, and the interrupt refresh operation related to #301 described above may be executed when the subsequent regular fresh command REF is input. The other operations other than the above-described operations are the same as in Embodiment 2.

As described above, according to Embodiment 3, in a case where u pieces of external input addresses when the active command ACT is input are successively the same as each other, the interrupt refresh operation is executed with respect to an address based on the external input address. Accordingly, the row hammer countermeasure circuit 50 can prevent occurrence of the row hammer issue in a more effective manner. Similarly, the DRAM device provided with the row hammer countermeasure circuit 50 can prevent occurrence of the row hammer issue in a more effective manner. In addition, as in Embodiment 1 and the like, it is not necessary for a counter to be provided for every word line, it is possible to more efficiently use a semiconductor chip area, and it is possible to reduce a chip area of the DRAM device having the same capacity in comparison to a DRAM device according to the related art.

Modification Example of Embodiment 3

(1) Various variations described in the modification examples of Embodiments 1 and 2 are also applicable to Embodiment 2. For example, the address latch circuits 60*a* and 60*b* may successively execute the latch operation, or the number of addresses to be latched may be 3 or greater. The interrupt refresh operation may be executed two or more times, and the nearby address may be widened to a plurality of word lines in which the row hammer issue may occur. In addition, as in the example illustrated in Embodiment 2, the external input command monitoring initiation timing or the external input address latching timing may be set in an arbitrary manner. In addition, the timing may be different between immediately after power supply and after execution of the regular refresh operation. In addition, the timing can be randomly set.

(2) In addition, in Embodiment 3, the upper limit u is set to a natural number of two or more, but it is preferable that an appropriate number is set as u in correspondence with a semiconductor process of manufacturing the DRAM device, a circuit configuration of the DRAM device, and the like. In addition, a configuration capable of setting u from the outside after completing the DRAM device is preferable.

Fourth. Embodiment 4

In Embodiments 1 to 3 described above, the interrupt refresh operation is performed on the basis of an external input address when the active command ACT is input with respect to a nearby address (adjacent address) of the external input address, it is possible to efficiently prevent occurrence of the row hammer issue.

However, the interrupt refresh operation is performed independently from the regular refresh operation, and thus both of the refresh operations may be executed with respect to the same address. However, redundant execution of the refresh operation with respect to the same address is useless, and thus the redundant execution may be a cause for unnecessary deterioration of a regular operation as a storage device. That is, in a case where an address when executing the regular refresh operation is a nearby address of the address that is latched by the address latch circuit, it is not necessary to perform the interrupt refresh operation.

In Embodiment 4, as described above, description will be given of a DRAM device that executes an operation of suppressing the interrupt refresh operation in a case where an address when executing the regular refresh operation is a nearby address of the address that is latched by the address latch circuit.

Configuration

Figure 7:
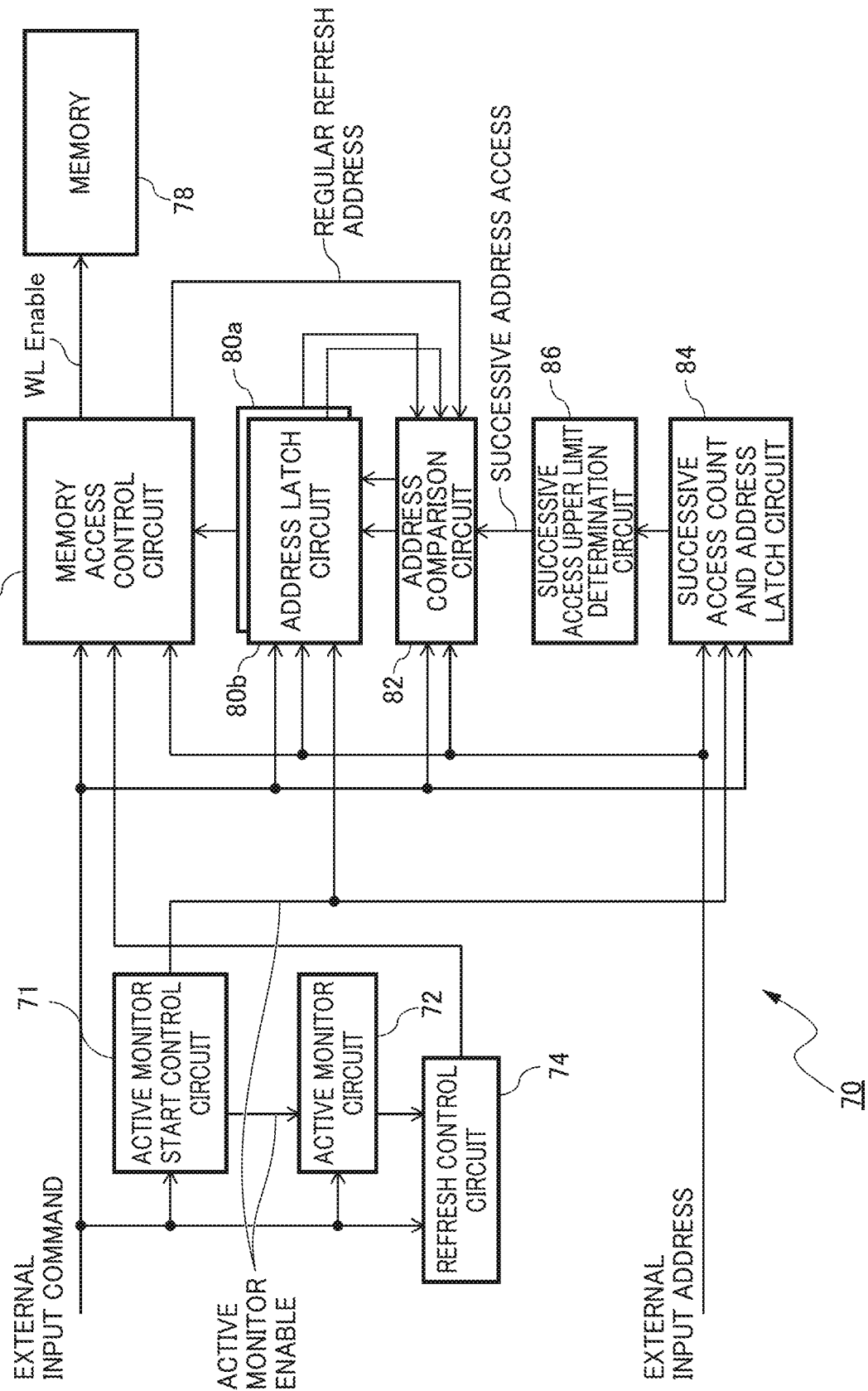
FIG. 7 is a circuit block diagram of a row hammer issue countermeasure circuit of a DRAM device according to Embodiment 4.

FIG. 7 is a circuit block diagram illustrating a row hammer countermeasure circuit 70 of the DRAM device according to Embodiment 4. The row hammer countermeasure circuit 70 illustrated in FIG. 7 is a part of a configuration of the DRAM device. In FIG. 7, a portion other than a memory 78 corresponds to the row hammer countermeasure circuit 70. That is, the row hammer countermeasure circuit 70 includes an active monitor start control circuit 71, an active monitor circuit 72, a refresh control circuit 74, a memory access control circuit 76, address latch circuits 80a and 80b, an address comparison circuit 82, a successive access count circuit 84, and a successive access upper limit determination circuit 86. FIG. 7, one characteristic configuration in Embodiment 4, which executes an operation different from FIG. 5 in Embodiment 3, is the address comparison circuit 82. In principle, the address comparison circuit 82 executes the same operation as in the address comparison circuit 62 in Embodiment 3 described above, but a configuration of executing comparison of addresses when executing the regular refresh operation is a characteristic configuration in Embodiment 4.

Even in Embodiment 4, the memory access control circuit 76 executes the regular refresh operation on the basis of an external input command and a control signal from the refresh control circuit 74. The operation is the same as in Embodiments 1 to 3. However, the memory access control circuit 76 according to Embodiment 4 outputs an address when executing the regular refresh operation to the outside as a regular refresh address. In addition, the address comparison circuit 82 compares whether or not the regular refresh address exists near an address that is latched by the address latch circuits 80a and 80b. From a result of the comparison, it is determined that the regular refresh address exists near the address that is latched by the address latch circuits 80a and 80b, the contents of the address latch circuits 80a and 80b are reset so as not to execute the interrupt refresh operation. In this case, an address that is reset is an address determined to exist near the regular refresh address, and an address of any one of the address latch circuits 80a and 80b or addresses of both of the address latch circuits 80a and 80b.

In a case where the regular refresh address exists near both addresses which are latched by the address latch circuits 80a and 80b, both of the addresses latched by the address latch circuits 80a and 80b are also reset, and as a result, the interrupt refresh operation is not executed.

In addition, in a case where the regular refresh address exists near any one of the addresses which are latched by the address latch circuits 80a and 80b, an address on a near side of the address latch circuit 80a or 80b is reset, and as a result, the interrupt refresh operation is executed with respect to a nearby address on the basis of an address that is not reset.

As a result, it is possible to prevent the regular refresh operation and the interrupt refresh operation from being redundantly executed with respect to a nearby address. As a result, it is possible to prevent an unnecessary refresh operation from being executed, and it is possible to more efficiently prevent occurrence of the row hammer issue. As a result, it is possible to provide a DRAM device of which performance as a DRAM device does not deteriorate more than necessary.

Operation

Hereinafter, an operation of the row hammer countermeasure circuit 70 of Embodiment 4 described in FIG. 7 will be described on the basis of a time chart of FIG. 8. As in the time chart of FIG. 6 in Embodiment 3, in the operation in the time chart of FIG. 8, an address #100 is latched by an address latch 1set, and an address #200 is latched by an address latch 2set. In addition, four active commands ACT based on the same address are successively input, and thus an address #300 is latched by the address latch 1set as in Embodiment 3. Incidentally, the address latch 1set is the address latch circuit 80a and the address latch 2set is the address latch circuit 80b.

Figure 8:
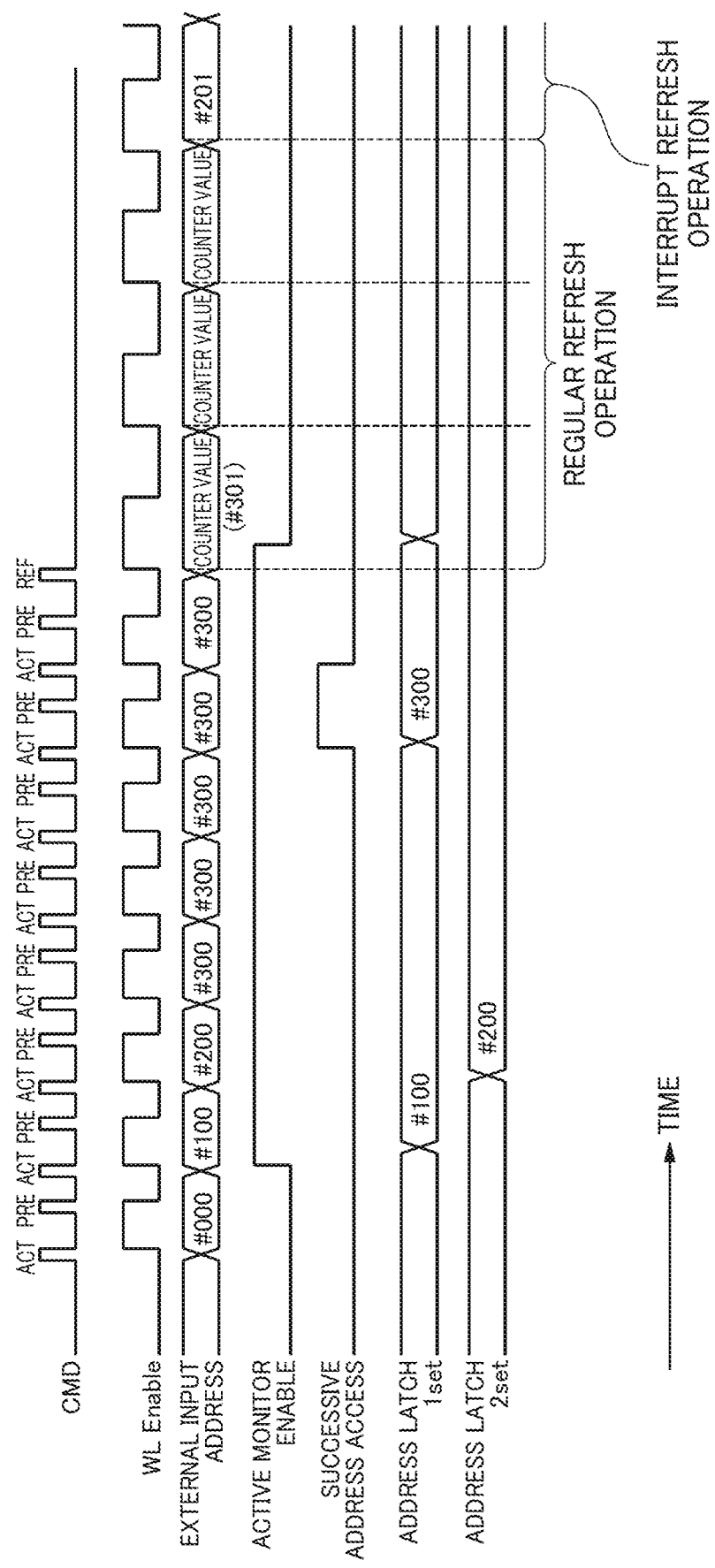
FIG. 8 is a time chart illustrating an operation of the row hammer issue countermeasure circuit according to Embodiment 4.

The time chart of FIG. 8 is different from the time chart of FIG. 6 in that a first address as a target of the regular refresh operation is #301. Accordingly, at a first cycle in which the regular refresh operation is executed in the time chart of FIG. 8, the address comparison circuit 82 determines that the regular refresh address (that is, #301) exists near the address #300 that is latched by the address latch 1set. Accordingly, the address comparison circuit 82 resets the address latch 1set that becomes the basis of determination as existence near the address #300.

Even in Embodiment 4, the interrupt refresh operation is executed subsequently to the regular refresh operation. At that time, a configuration in which an address that becomes a target of the interrupt refresh operation is obtained on the basis of the address latch 1set (or 2set) is the same as in Embodiments 1 to 3. In the example of FIG. 8, the address latch 1set is reset, and thus an address related to the interrupt refresh operation is obtained on the basis of an address that is latched by the address latch 2set. Even in Embodiment 4, as described above, #201 obtained by inverting the lowermost one bit of the address #200 that is latched by the address latch 2set is obtained as an address that becomes the target of the interrupt refresh operation. As a result, as illustrated in FIG. 8, the interrupt refresh operation is executed with respect to the address #201.

As described above, according to Embodiment 4, determination is made as to whether or not the regular refresh address exists near an address that becomes the basis of the interrupt refresh operation (an address that is latched), and in a case where the regular refresh address exists near the address, the interrupt refresh operation with respect to an address (nearby address) based on the address is suppressed. As a result, it is possible to prevent the refresh operation from being redundantly performed with respect to the nearby address. Accordingly, it is possible to prevent occurrence of the row hammer issue in a more efficient manner, and it is possible to provide a DRAM device of which performance does not deteriorate more than necessary.

Modification Example of Embodiment 4

(1) Various variations described in the modification examples of Embodiments 1 to 3 are also applicable to Embodiment 4.

(2) In addition, in Embodiment 4, the address comparison circuit 82 determines whether or not the regular refresh address exists near an address latched by the address latch circuit 80. The gist of determination as to whether or not the regular refresh address exists near the address is slightly different from simple address comparison. Accordingly, the address comparison circuit 82 of Embodiment 4 may be provided in a configuration different from that of the address comparison circuits 22, 42, and 62 of Embodiments 1 to 3. The "nearby" address is an address that represents a word line that is susceptible to occurrence of the row hammer issue, and one nearby address may be exist or a plurality of the nearby addresses may be exist. Particularly, in this embodiment, description has been given of a case where an address of a word line adjacent to a word line accessed by an active command is set as a preferable example. In addition, particularly, preferred examples of the address of the adjacent word include an address that is incremented by "+1" or decremented by "−1" with respect to an address that becomes the basis. For example, it is preferable that the address is set to an address obtained by inverting the lowermost bit of the address that becomes the basis.

(3) In addition, in Embodiment 4, the regular refresh address is output to the memory access control circuit 76. The reason for this is to be because the memory access control circuit 76 includes a counter of the refresh address. However, the regular refresh address may be output by another circuit to be supplied to the memory access control circuit 76. For example, the refresh control circuit 74 may be provided with a refresh counter and the like to manage the regular refresh address. In this case, the refresh control circuit 74 supplies the regular refresh address to the address comparison circuit 82.

CONCLUSION

Hereinbefore, embodiments of the invention have been described in detail, but it should be understand that the above-described embodiments illustrate only specific examples for carrying out the invention. The technical range of the invention is not limited by the above-described embodiments. Various modifications can be made within a range not departing from the gist of the invention, and the modifications are included in the technical range of the invention.

EXPLANATION OF REFERENCE NUMERALS

10, 30, 50, 70 ROW HAMMER COUNTERMEASURE CIRCUIT
12, 32, 52, 72 ACTIVE MONITOR CIRCUIT
14, 34, 54, 74 REFRESH CONTROL CIRCUIT
16, 36, 56, 76 MEMORY ACCESS CONTROL CIRCUIT
18, 38, 58, 78 MEMORY
20a, 20b, 40a, 40b, 60a, 60b, 80a, 80b ADDRESS LATCH CIRCUIT
22, 42, 62, 82 ADDRESS COMPARISON CIRCUIT
31, 51, 71 ACTIVE MONITOR START CONTROL CIRCUIT
64, 84 SUCCESSIVE ACCESS COUNT CIRCUIT
66, 86 SUCCESSIVE ACCESS UPPER LIMIT DETERMINATION CIRCUIT

The invention claimed is:

1. A semiconductor storage device, comprising:
a memory unit that includes a plurality of memory cells;
an address latch unit that receives an address and an active command that is applied to the memory cells designated by the address, and latches the address at the time of receiving the active command whenever the active command is received;
a refresh control unit that instructs a memory access control unit to execute a regular refresh operation based on a refresh command with respect to the memory unit in the case of receiving the refresh command, and instructs the memory access control unit to execute an interrupt refresh operation, which is a refresh operation based on the address latched by the address latch unit, with respect to a nearby address of the address; and
the memory access control unit that executes the regular refresh operation and the interrupt refresh operation continuously with respect to the memory unit responding to one time of executing the refresh command on the basis of the instruction from the refresh control unit.

2. The semiconductor storage device according to claim 1, further comprising:
a monitor unit that monitors the active command that is received, and prevents the refresh control unit from instructing the memory access control unit to perform the interrupt refresh operation in a case where the active command is not received after receiving the refresh command.

3. The semiconductor storage device according to claim 1, wherein the nearby address of the address at the time of receiving the active command is either an address obtained by incrementing the address at the time of receiving the active command by "+1" or an address obtained by decrementing the address at the time of receiving the active command by "−1".

4. The semiconductor storage device according to claim 1, wherein the active command is a command that activates a word line of the memory unit, and includes at least a read command, a write command, and a refresh command.

5. A semiconductor storage device, comprising:
a memory unit that includes a plurality of memory cells;
an address latch unit that receives an address and an active command that is applied to the memory cells designated by the address, latches the address at the time of receiving the active command whenever the active command is received, and retains n latched addresses;
a refresh control unit that instructs a memory access control unit to execute a regular refresh operation based on a refresh command on the memory unit in the case of receiving the refresh command, and instructs the memory access control unit to execute an interrupt refresh operation, which is a refresh operation based on one or more addresses latched by the address latch unit, on a nearby address of one of the one or more addresses; and
the memory access control unit that executes the regular refresh operation and the interrupt refresh operation on the memory unit on the basis of the instruction from the refresh control unit,
wherein the address latch unit is reset in a case where the memory access control unit executes the interrupt refresh operation, and enters a state capable of latching a subsequent address at the time of receiving a subsequent active command, and
wherein n is a natural number of two or three or more.

6. The semiconductor storage device according to claim 5, wherein in the address latch unit, in a case where the memory access control unit executes the interrupt refresh operation, only an address that becomes the basis of the interrupt refresh operation is reset, and the address latch unit enters a state capable of latching an address at the time of receiving the subsequent active command.

7. The semiconductor storage device according to claim 5, wherein the refresh control unit instructs the memory access control unit to execute an interrupt refresh operation, which is a refresh operation based on any one address of the addresses latched by the address latch unit, with respect to only a nearby address of the one address, and in the address latch unit, in a case where the refresh control unit executes the interrupt refresh operation, the only one address that becomes the basis of the interrupt refresh operation is reset, and the address latch unit enters a state capable of latching an address at the time of receiving the subsequent active command.

8. The semiconductor storage device according to claim 5, further comprising:

a monitor start unit that allows a latch operation of the address latch unit to be initiated after receiving m pieces of the active command from reception of the refresh command, wherein m is a natural number.

9. The semiconductor storage device according to claim 8, wherein the monitor start unit allows a latch operation of the address latch unit to be initiated after receiving arbitrary k pieces of the active commands from reception of the refresh command, and wherein k is an arbitrary natural number.

10. The semiconductor storage device according to claim 5, further comprising:

an access count address latch unit that receives an address and an active command that is applied to the memory cells designated by the address, monitors the address at the time of receiving the active command, and counts the number of times of access with respect to the same address; and an upper limit determination unit that allows the address latch unit to latch the same address in a case where the number of times of access to the same address, which is counted by the access count address latch unit, exceeds a predetermined value.

11. The semiconductor storage device according to claim 1, further comprising:

an address comparison unit that compares the address at the time of receiving the active command and an address that is latched already by the address latch unit, and allows the address latch unit to execute a latch operation in a case where the addresses are different from each other from a result of the comparison.

12. The semiconductor storage device according to claim 11, wherein in a case where a refresh address when the refresh control unit instructs the memory access control unit to perform the regular refresh operation is a nearby address of the address that is latched by the address latch unit, the address comparison unit resets the address that is latched by the address latch unit.

13. The semiconductor storage device according to claim 5, further comprising:

an address comparison unit that compares less than n pieces of addresses which are latched already by the address latch unit and the address at the time of receiving the active command, and allows the address latch unit to execute a latch operation of an address at the time of newly receiving the active command only in a case where the addresses are different from each other from a result of the comparison.

* * * * *